United States Patent
Omi et al.

(10) Patent No.: US 10,345,386 B2
(45) Date of Patent: Jul. 9, 2019

(54) BATTERY STATE ESTIMATION DEVICE AND METHOD OF ESTIMATING BATTERY STATE

(71) Applicant: Panasonic Intellectual Property Management Co., Ltd., Osaka (JP)

(72) Inventors: Toru Omi, Hiroshima (JP); Kenichi Miura, Osaka (JP); Satoru Hiwa, Kanagawa (JP); Takuma Iida, Kanagawa (JP); Kazushige Kakutani, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 196 days.

(21) Appl. No.: 15/118,426

(22) PCT Filed: Feb. 27, 2015

(86) PCT No.: PCT/JP2015/001027
§ 371 (c)(1),
(2) Date: Aug. 11, 2016

(87) PCT Pub. No.: WO2015/133103
PCT Pub. Date: Sep. 11, 2015

(65) Prior Publication Data
US 2017/0176540 A1    Jun. 22, 2017

(30) Foreign Application Priority Data
Mar. 3, 2014  (JP) ................................. 2014-040460

(51) Int. Cl.
*H02J 7/00* (2006.01)
*H01M 10/06* (2006.01)
(Continued)

(52) U.S. Cl.
CPC ......... *G01R 31/367* (2019.01); *G01R 31/389* (2019.01); *G01R 31/3842* (2019.01);
(Continued)

(58) Field of Classification Search
CPC .................................................. G01R 31/3651
See application file for complete search history.

(56) References Cited

U.S. PATENT DOCUMENTS

| | | | | |
|---|---|---|---|---|
| 6,127,806 A | * | 10/2000 | Tanjo | G01R 31/374 320/132 |
| 2014/0257726 A1 | * | 9/2014 | Baba | G01R 31/3648 702/63 |
| 2014/0340045 A1 | * | 11/2014 | Itabashi | G01R 31/3624 320/134 |

FOREIGN PATENT DOCUMENTS

| JP | 5291845 B | 9/2013 |
|---|---|---|
| WO | 2008/152875 | 12/2008 |

OTHER PUBLICATIONS

International Search Report of PCT application No. PCT/JP2015/001027 dated May 26, 2015.

\* cited by examiner

*Primary Examiner* — Manuel A Rivera Vargas
(74) *Attorney, Agent, or Firm* — Seed IP Law Group LLP

(57) ABSTRACT

A battery state estimation device includes a detecting part, a state of charge (SOC) estimating part, an open circuit voltage (OCV) estimating part, a terminal voltage estimating part, and a correcting part. The detecting part detects a charge-discharge current and a terminal voltage of a battery. The SOC estimating part estimates an SOC of the battery, based on the charge-discharge current detected by the detecting part. The OCV estimating part estimates an OCV of the battery, based on the SOC estimated by the SOC estimating part and a relationship between an OCV and the SOC of the
(Continued)

battery. The terminal voltage estimating part calculates an estimated terminal voltage, based on the charge-discharge current and the terminal voltage detected by the detecting part and on an equivalent circuit model constructed using an inversely proportional curve. The correcting part corrects the SOC estimated by the SOC estimating part, based on the estimated terminal voltage calculated by the terminal voltage estimating part and the terminal voltage detected by the detecting part.

12 Claims, 16 Drawing Sheets

(51) Int. Cl.
| | |
|---|---|
| *H01M 10/42* | (2006.01) |
| *H01M 10/44* | (2006.01) |
| *H01M 10/48* | (2006.01) |
| *G01R 31/367* | (2019.01) |
| *G01R 31/389* | (2019.01) |
| *G01R 31/3842* | (2019.01) |

(52) U.S. Cl.
CPC ....... *H01M 10/06* (2013.01); *H01M 10/4285* (2013.01); *H01M 10/48* (2013.01); *H01M 10/44* (2013.01); *H01M 2220/20* (2013.01); *H02J 7/00* (2013.01); *Y02E 60/126* (2013.01); *Y02T 10/7016* (2013.01)

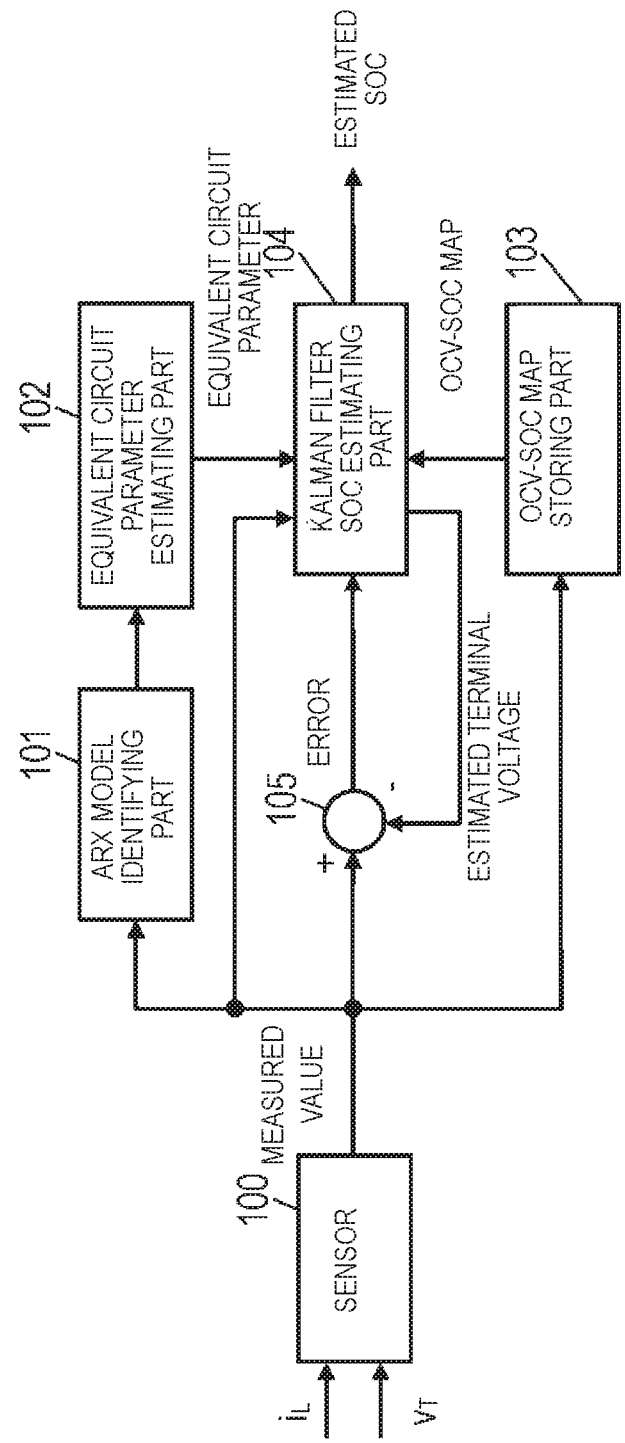

BATTERY STATE ESTIMATION DEVICE AND METHOD OF ESTIMATING BATTERY STATE

CROSS-REFERENCE TO RELATED APPLICATIONS

This application is a U.S. national stage application of the PCT International Application No. PCT/JP2015/001027 filed on Feb. 27, 2015, which claims the benefit of foreign priority of Japanese patent application 2014-040460 filed on Mar. 3, 2014, the contents all of which are incorporated herein by reference.

TECHNICAL FIELD

The present invention relates to a battery state estimation device for estimating an internal state of a battery with high accuracy, and to a method of estimating a battery state.

BACKGROUND ART

A vehicle powered primarily by an engine includes a battery serving as a power source for a starter motor used to start the engine. A typical example of such a battery is a lead-acid battery. In recent years, charge-discharge characteristics of a lead-acid battery have improved. With this improvement, a lead-acid battery is increasingly common as a power source for a special electric vehicle, such as an electric cart and a fork lift, which conventionally uses a lithium-ion secondary battery so expensive as to make the special electric vehicle unprofitable.

A dead battery or a battery that has been degraded in performance ranks first in a number of troubles that private vehicles suffer (specifically, the number indicates how many times Japan Automobile Federation (JAF) is called to come to the rescue of vehicles). In recent years, a stop-start system has become more common in a vehicle powered primarily by an engine in an effort to reduce emissions. However, while the stop-start system stops the engine, a remaining capacity of a battery may decrease to a point where the battery cannot generate an output high enough to restart the engine. Accordingly, it is desirable to detect a remaining capacity of a battery with high accuracy so that such a battery problem is prevented (see, for example, PTL 1).

Generally, an open circuit voltage (hereinafter referred to as "OCV") and a remaining capacity of a lead-acid battery are known to be linearly related. PTL 1 describes a technique of calculating a remaining capacity, based on an OCV measured, using the linear relationship.

PTL 2 discloses an invention that accurately estimates a state of charge (hereinafter referred to as "SOC"), which is a remaining capacity of a battery, by constructing an equivalent circuit model of the battery in consideration of a polarization component and estimating an internal state of the battery with high accuracy.

CITATION LIST

Patent Literature

PTL 1: WO 2008/152875
PTL 2: Japanese Patent No. 5, 291, 845

SUMMARY OF THE INVENTION

Exemplary embodiments of the present invention provide a battery state estimation device and a method of estimating a battery state which increase accuracy in both a terminal voltage estimation and an SOC estimation associated with the terminal voltage estimation by using a simple construction. The battery state estimation device according to the exemplary embodiments of the present invention includes a detecting part, an SOC estimating part, an OCV estimating part, a terminal voltage estimating part, and a correcting part. The detecting part detects a charge-discharge current and a terminal voltage of a battery. The SOC estimating part estimates an SOC of the battery, based on the charge-discharge current detected by the detecting part. The OCV estimating part estimates an OCV of the battery, based on the SOC estimated by the SOC estimating part and a relationship between an OCV and the SOC of the battery. The terminal voltage estimating part calculates an estimated terminal voltage, based on the charge-discharge current and the terminal voltage detected by the detecting part and an equivalent circuit model constructed using an inversely proportional curve (i.e., an equivalent circuit model constructed using a function that is inversely proportional to a power). The correcting part corrects the SOC estimated by the SOC estimating part, based on the estimated terminal voltage calculated by the terminal voltage estimating part and the terminal voltage detected by the detecting part.

A method of estimating a battery state according to the exemplary embodiments of the present invention includes the steps of: detecting a charge-discharge current and a terminal voltage of a battery; estimating an SOC of the battery, based on the charge-discharge current detected in the detecting step; estimating an OCV of the battery, based on the SOC estimated in the SOC estimating step and a relationship between an OCV and the SOC of the battery; calculating an estimated terminal voltage, based on the charge-discharge current and the terminal voltage detected in the detecting step and an equivalent circuit model constructed using an inversely proportional curve (i.e., an equivalent circuit model constructed using a function that is inversely proportional to a power); and correcting the SOC estimated in the SOC estimating step, based on the estimated terminal voltage calculated in the terminal voltage estimating step and the terminal voltage detected in the detecting step.

The exemplary embodiments of the present invention enable a state estimation that considers a slow-response component of a battery without using a higher-order equivalent circuit model. Consequently, accuracy in both a terminal voltage estimation and an associated SOC estimation for a battery improves by using a simple construction.

BRIEF DESCRIPTION OF DRAWINGS

FIG. 1A is a block diagram illustrating a configuration of a battery state estimation device according to a first exemplary embodiment of the present invention.

DESCRIPTION OF EXEMPLARY EMBODIMENTS

Before describing exemplary embodiments of the present invention, a disadvantage with a conventional battery state estimation device will be described. Conventionally, a terminal voltage is estimated by identifying parameters of a battery model in an SOC estimation using a Kalman filter, as described in the PTL 2. However, a first-order equivalent circuit model constructed using an exponential function cannot express a slow-response component (i.e., a polarization relaxation component) when estimating a terminal voltage. Expressing the slow-response component requires a higher-order equivalent circuit model, which greatly increases computational effort and processing time for an ECU (Electrical Control Unit) having a limited processing capacity, making the estimation impractical.

The exemplary embodiments of the present invention will now be described with reference to the accompanying drawings. It should be noted that the exemplary embodiments described below are by way of example and are not intended to limit the scope of the present invention. In the accompanying drawings, like numerals denote similar elements, and description of the similar elements will not be repeated as appropriate.

First Exemplary Embodiment

Figure 1B:
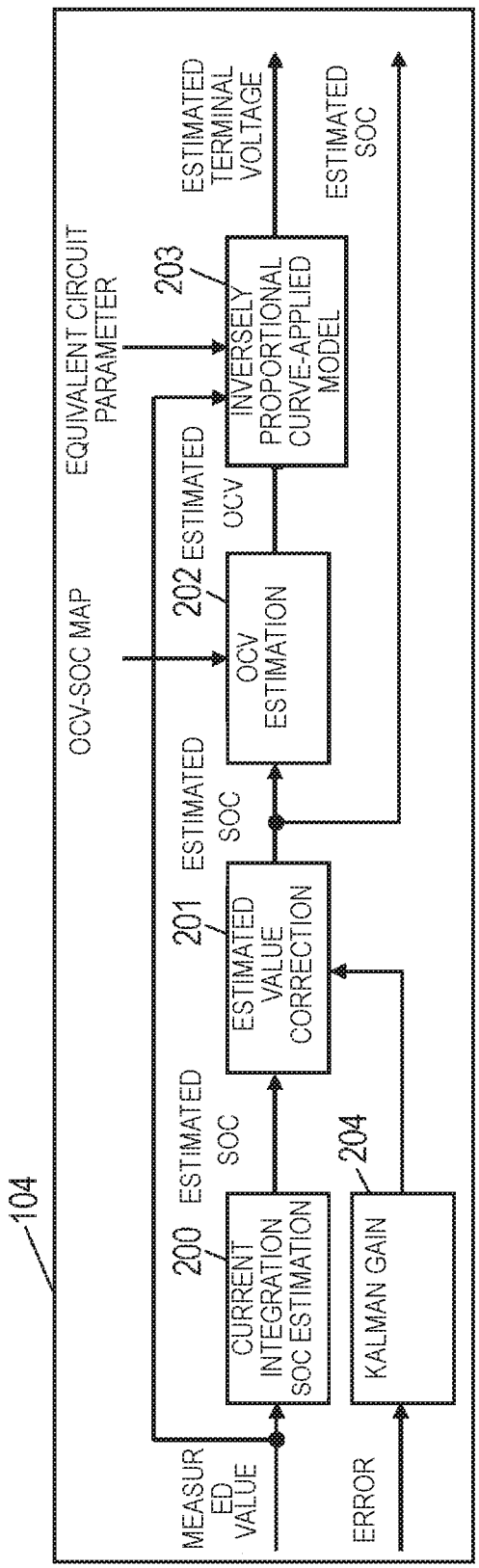
FIG. 1B illustrates a processing algorithm of a Kalman filter SOC estimating part illustrated in FIG. 1A.

FIG. 1A is a block diagram illustrating a configuration of a battery state estimation device according to a first exemplary embodiment of the present invention. The battery state estimation device is, for example, an ECU. The battery state estimation device includes sensor 100, ARX (Autoregressive Exogenous) model identifying part 101, equivalent circuit parameter estimating part 102, OCV-SOC map storing part 103, Kalman filter SOC estimating part 104, and error calculating part 105. Sensor 100 measures a charge-discharge current and a terminal voltage of a battery (e.g., a secondary rechargeable battery such as a lead-acid battery used for activating a stop-start system). Sensor 100 includes, for example, a current sensor and a voltage sensor. Charge-discharge current $i_L$ and terminal voltage $v_T$ measured by sensor 100 are output, as appropriate, to ARX model identifying part 101, equivalent circuit parameter estimating part 102, OCV-SOC map storing part 103, Kalman filter SOC estimating part 104, and error calculating part 105. Charge-discharge current $i_L$ and terminal voltage $v_T$ are used in computations performed by the respective parts.

ARX model identifying part 101, equivalent circuit parameter estimating part 102, OCV-SOC map storing part 103, Kalman filter SOC estimating part 104, and error calculating part 105 are each constituted by hardware including a central processing unit (CPU), a memory, and a random access memory (RAM), which are all not shown. The hardware components may be consolidated into an integrated circuit (e.g., a large scale integration (LSI)). ARX model identifying part 101, equivalent circuit parameter estimating part 102, OCV-SOC map storing part 103, Kalman filter SOC estimating part 104, and error calculating part 105 each include, as software, programs. The computations are processed by the CPU, based on pre-stored data and programs stored on the memory (not shown). Results of the computations are temporarily stored on the RAM (not shown) for subsequent processes.

Figure 2:
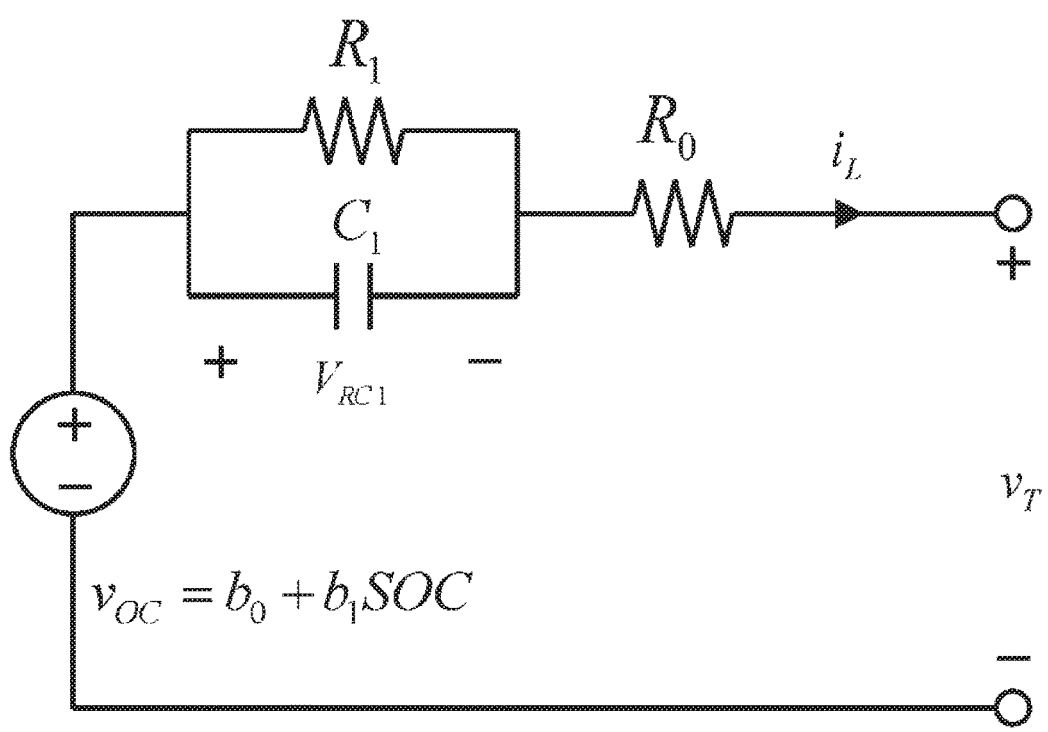
FIG. 2 illustrates a terminal voltage estimation model, which is a first-order equivalent circuit.

FIG. 2 illustrates a terminal voltage estimation model, which is a first-order equivalent circuit. A state space representation of the model is given by the following formula:

$$\begin{bmatrix} SOC[k+1] \\ b_0[k+1] \\ V_{RC1}[k+1] \end{bmatrix} = \begin{bmatrix} 1 & 0 & 0 \\ 0 & 1 & 0 \\ 0 & 0 & 1-\dfrac{\Delta t}{R_1 C_1} \end{bmatrix} \begin{bmatrix} SOC[k] \\ b_0[k] \\ V_{RC1}[k] \end{bmatrix} + \begin{bmatrix} -\dfrac{\Delta t}{Q_R} \\ 0 \\ \dfrac{\Delta t}{C_1} \end{bmatrix} i_L[k] \quad \text{[Formula 1]}$$

$$v_T[k] = \begin{bmatrix} b_1 & 1 & -1 \end{bmatrix} \begin{bmatrix} SOC[k] \\ b_0[k] \\ V_{RC1}[k] \end{bmatrix} - R_0 i_L[k]$$

In the formula, QR is a nominal capacity of a battery.

Equivalent circuit parameters of the first-order equivalent circuit model are estimated by comparing a transfer function calculated by ARX model identifying part 101 with a transfer function calculated by equivalent circuit parameter estimating part 102.

A process performed by ARX model identifying part 101 will be described. ARX model identifying part 101 identifies an ARX model by using a known least squares method. This processing is performed by referring to, for example, a publicly available non-patent literature: H. Rahimi Eichi and M.-Y. Chow, "Adaptive Online Battery Parameters/SOC/Capacity Co-estimation" IEEE Transportation Electrification Conference and Expo (ITEC), 2013. For the ARX model, the following polynomials of $z^{-1}$ are used.

$A(z)=1+a_1 z^{-1}+\ldots +a_p z^{-p}$ $B(z)=b_0+b_1 z^{-1}+\ldots +b_q z^{-q}$ [Formula 2]

The ARX model is a class in which a relationship between input u(k) and output y(k) is modelled as follows:

$$A(z)y(k)=B(z)u(k)+e(k) \quad \text{[Formula 3]}$$

With the following formula, regression coefficients $a_1, \ldots, a_p, b_0, \ldots, b_q$ are determined so that $y(k)-\Phi(k)\theta$ is minimum.

$$y(k)=[-y(k-1) \ldots -y(k-p)u(k) \ldots u(k-q)][a_1 \ldots a_p \; b_0 \ldots b_q]^T+e(k)=\Phi(k)\theta+e(k) \quad \text{[Formula 4]}$$

When the parameter is estimated from multiple data sets, the following formulae are used.

$$\begin{bmatrix} y(k) \\ y(k-1) \\ \vdots \end{bmatrix} = \begin{bmatrix} -y(k-1) & -y(k-2) & \cdots \\ -y(k-2) & -y(k-3) & \\ \vdots & & \ddots \end{bmatrix} \begin{bmatrix} a_1 \\ a_2 \\ \vdots \end{bmatrix} + \begin{bmatrix} e(k) \\ e(k-1) \\ \vdots \end{bmatrix} \Rightarrow y = \Phi\theta + e \quad \text{[Formula 5]}$$

$$\min\|e\|^2 = \min\|y-\Phi\theta\|^2 \Rightarrow \theta = (\Phi^T\Phi)^{-1}\Phi^T y \quad \text{[Formula 6]}$$

A transfer function of the ARX model is given by the following formula:

$$G(z) = \frac{B(z)}{A(z)} \quad \text{[Formula 7]}$$

ARX model identifying part 101 performs a digital z-transformation on an amount of change in charge-discharge current $i_L$ and terminal voltage $v_T$ output from sensor 100 so that the following formula is obtained:

$$\frac{\Delta v_T[z]}{\Delta i_L[z]} = \frac{c_0 + c_1 z^{-1}}{1 + a_1 z^{-1}} \quad \text{[Formula 8]}$$

With this formula, coefficients $a_1, c_0, c_1$ are calculated.

Equivalent circuit parameter identifying part 102 estimates parameters of an equivalent circuit by comparing the transfer function of the ARX model with a transfer function of an equivalent circuit. This relationship is given by the following formula:

$$\frac{\Delta v_T[z]}{\Delta i_L[z]} = \frac{c_0 + c_1 z^{-1}}{1 + a_1 z^{-1}} = \frac{-R_0 + \left\{-\frac{\Delta t}{C_1} - R_0\left(\frac{\Delta t}{R_1 C_1} - 1\right)\right\} z^{-1}}{1 + \left(\frac{\Delta t}{R_1 C_1} - 1\right) z^{-1}} \quad \text{[Formula 9]}$$

This formula is derived as follows:

$$v_T[k]-v_T[k-1]=-V_{RC1}[k]+V_{RC1}[k-1]-R_0(i_L[k]-i_L[k-1]) \quad \text{[Formula 10]}$$

where $$v_T[k]=b_1 SOC[k]+b_0[k]-V_{RC1}[k]-R_0 i_L[k]=v_{OC}[k]-V_{RC1}[k]-R_0 i_L[k]$$

$$v_T[k]-v_T[k-1]=v_{OC}[k]-v_{OC}[k-1]-V_{RC1}[k]+V_{RC1}[k-1]-R_0(i_L[k]-i_L[k-1])$$

$$v_{OC}[k]-v_{OC}[k-1]\approx 0$$

Z-transformation is performed $$zV_{RC1}[z] = \left(1 - \frac{\Delta t}{R_1 C_1}\right)V_{RC1}[z] + \frac{\Delta t}{C_1} i_L[z] \to V_{RC1}[z] = \frac{\frac{\Delta t}{C_1} z^{-1}}{1 + \left(\frac{\Delta t}{R_1 C_1} - 1\right) z^{-1}} i_L[z]$$

$$v_T[z](1-z^{-1}) = -V_{RC1}[z](1-z^{-1}) - R_0 i_L[z](1-z^{-1}) = \frac{-\frac{\Delta t}{C_1} z^{-1}}{1 + \left(\frac{\Delta t}{R_1 C_1} - 1\right) z^{-1}} i_L[z](1-z^{-1}) - R_0 i_L[z](1-z^{-1})$$

$$\frac{v_T[z](1-z^{-1})}{i_L[z](1-z^{-1})} = \frac{\Delta v_T[z]}{\Delta i_L[z]} = \frac{-\frac{\Delta t}{C_1} z^{-1}}{1 + \left(\frac{\Delta t}{R_1 C_1} - 1\right) z^{-1}} - R_0 = \frac{-R_0 + \left\{-\frac{\Delta t}{C_1} - R_0\left(\frac{\Delta t}{R_1 C_1} - 1\right)\right\} z^{-1}}{1 + \left(\frac{\Delta t}{R_1 C_1} - 1\right) z^{-1}}$$

Equivalent circuit parameter estimating part 102 estimates parameters $R_0, R_1, C_1$ of the equivalent circuit model illustrated in FIG. 2, based on the formula, and outputs the estimated parameters to Kalman filter SOC estimating part 104. ARX model identifying part 101 and equivalent circuit parameter estimating part 102 perform the processes with a predetermined sampling period of, for example, 0.05 [s] to update the parameters.

OCV-SOC map storing part 103 outputs, to Kalman filter SOC estimating part 104, information on an OCV-SOC map that OCV-SOC map storing part 103 pre-stores and which indicates a relationship between an OCV and an SOC. In the map, the OCV-SOC relationship is indicated by a linear function.

Additionally, a lower limit of an OCV indicated by the function and a gradient of the function are respectively preset to $b_0$ and $b_1$. OCV-SOC map storing part 103 outputs the preset values to ARX model identifying part 101 and equivalent circuit parameter estimating part 102. In the present exemplary embodiment, at least the regression coefficient needs to be output as the OCV-SOC map from OCV-SOC map storing part 103. This applies to the other exemplary embodiment. With regard to the information on the OCV-SOC map, a map may be selected, or a plurality of maps may be selected based on a type of a battery. For example, OCV-SOC map storing part 103 may determine a type of a battery, based on measured charge-discharge current value $i_L$ and measured terminal voltage value $v_T$ output from sensor 100, and select an OCV-SOC map corresponding to the type of the battery. This configuration prevents or inhibits decrease in accuracy in an SOC estimation even if the battery is replaced.

A process performed by Kalman filter SOC estimating part 104 will be described in detail. Kalman filter SOC estimating part 104 estimates a terminal voltage and an SOC by using the following state-space representation:

$$\begin{cases} x[k+1] = Ax[k] + bu[k] \\ y = cx[k] + du[k] \end{cases} \quad \text{[Formula 11]}$$

Specifically, with the state-space representation serving as a formula of a first-order equivalent circuit model, Kalman filter SOC estimating part 104 performs the estimations by using the following formulae, as will be described in detail later.

$$\begin{bmatrix} SOC[k+1] \\ b_0[k+1] \\ V_{RC}[k+1] \end{bmatrix} = \begin{bmatrix} 1 & 0 & 0 \\ 0 & 1 & 0 \\ 0 & 0 & 1-\frac{\Delta t}{R_1 C_1} \end{bmatrix} \begin{bmatrix} SOC[k] \\ b_0[k] \\ V_{RC_1}[k] \end{bmatrix} + \begin{bmatrix} -\frac{\Delta t}{Q_R} \\ 0 \\ \frac{\Delta t}{C_1} \end{bmatrix} i_L[k] + \quad \text{[Formula 12]}$$

$$g[k+1]e[k+1]$$

$$v_T[k] = \begin{bmatrix} b_1 & 1 & -1 \end{bmatrix} \begin{bmatrix} SOC[k] \\ b_0[k] \\ V_{RC_1}[k] \end{bmatrix} - R_0 i_L[k]$$

As a processing algorithm, current integration SOC estimation processing 200, estimated value correction processing 201, OCV estimation processing 202, inversely proportional curve-applied model processing 203, and Kalman gain processing 204 are performed. In current integration SOC estimation processing 200, Kalman filter SOC estimating part 104 estimates an SOC by integrating charge-discharge current $i_L$ output from sensor 100. In estimated value correction processing 201, Kalman filter SOC estimating part 104 corrects an estimated SOC' by using a Kalman gain described later. The resultant estimated SOC is output as a present SOC to an external element. In OCV estimation processing 202, Kalman filter SOC estimating part 104 calculates an estimated OCV, based on an OCV-SOC map output from OCV-SOC map storing part 103 and on the resultant estimated SOC. In inversely proportional curve-applied model processing 203, Kalman filter SOC estimating part 104 calculates an estimated terminal voltage, based on equivalent circuit parameters output from equivalent circuit parameter estimating part 102, charge-discharge current value $i_L$ output from sensor 100, and an estimated OCV output in OCV estimation processing 202. Error calculating part 105 calculates error e[k] between the estimated terminal voltage and terminal voltage $v_T$ output from sensor 100. In Kalman gain processing 204, Kalman filter SOC estimating part 104 corrects error e[k] by multiplying error e[k] by Kalman gain g[k].

Figure 3:
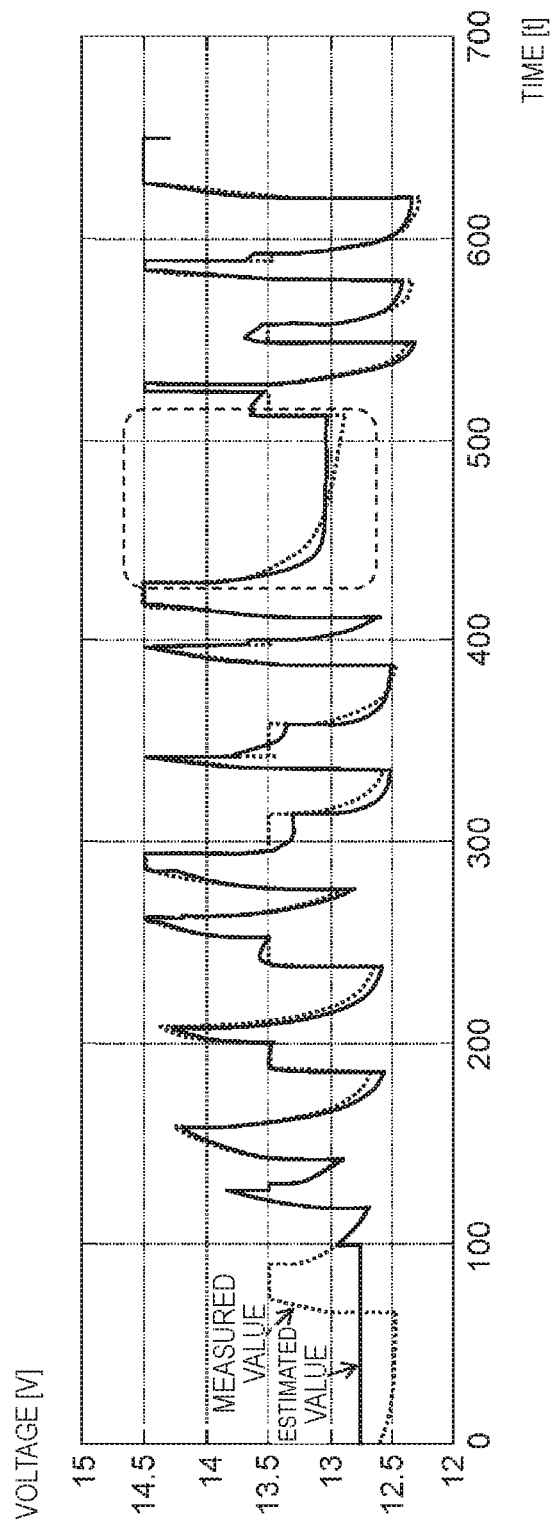
FIG. 3 illustrates an error between measured terminal voltages and terminal voltages estimated using the terminal voltage estimation model, which is the first-order equivalent circuit.
Figure 4:
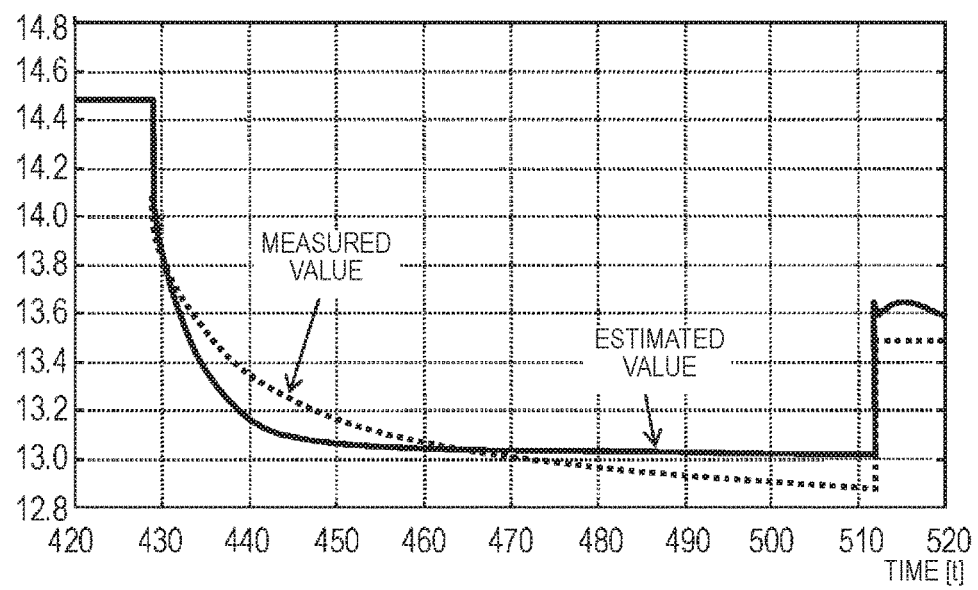
FIG. 4 is an enlarged view of a portion of FIG. 3 within a dotted line.

FIG. 3 illustrates an error between measured terminal voltage $v_T$ and terminal voltage $v_T$ estimated using the terminal voltage estimation model (the first-order equivalent circuit) illustrated in FIG. 2. FIG. 4 is an enlarged view of a portion of FIG. 3 within a dotted line. As shown in FIGS. 3 and 4, the error between the estimated values and the measured values increases over time because a first-order equivalent circuit constructed using an exponential function (Exp function) cannot express a polarization component of a long time constant.

To enable the expression of the polarization component, Kalman filter SOC estimating part 104, in performing inversely proportional curve-applied model processing 203, estimates a terminal voltage and an SOC, using a terminal voltage estimation model constructed using an inversely proportional curve.

Figure 5:
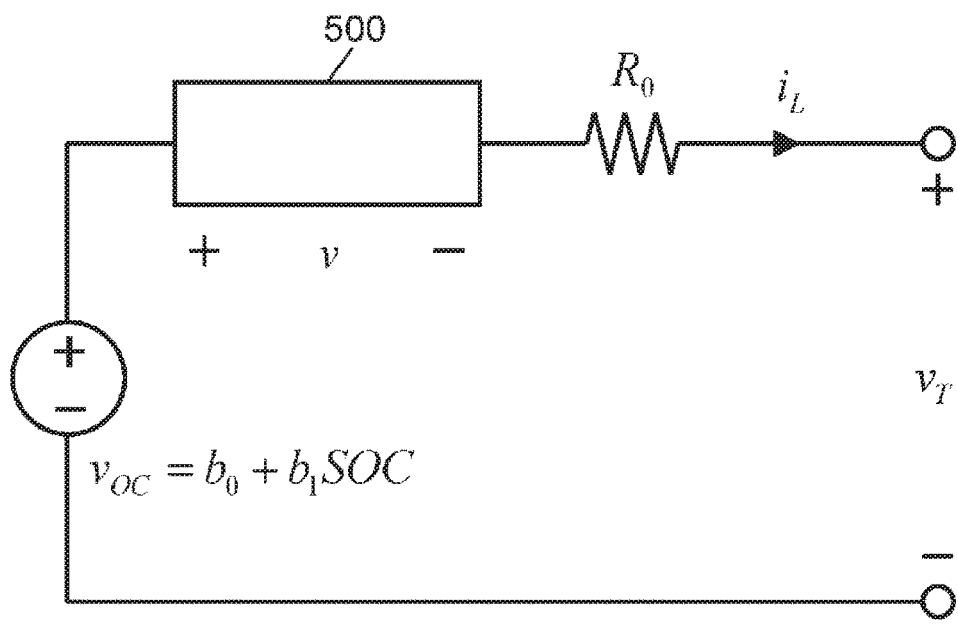
FIG. 5 illustrates a terminal voltage estimation model constructed using an inversely proportional curve.

FIG. 5 illustrates the terminal voltage estimation model constructed using the inversely proportional curve. As illustrated in FIG. 5, in the terminal voltage estimation model that is constructed using an inversely proportional curve and is used in inversely proportional curve-applied model processing 203, a first-order resistor-capacitor parallel circuit (illustrated in FIG. 2) is replaced with inversely proportional curve-applied part 500. This terminal voltage estimation model constructed using the inversely proportional curve can express a slow-response component of a battery without using a higher-order resistor-capacitor parallel circuit.

Figure 6:
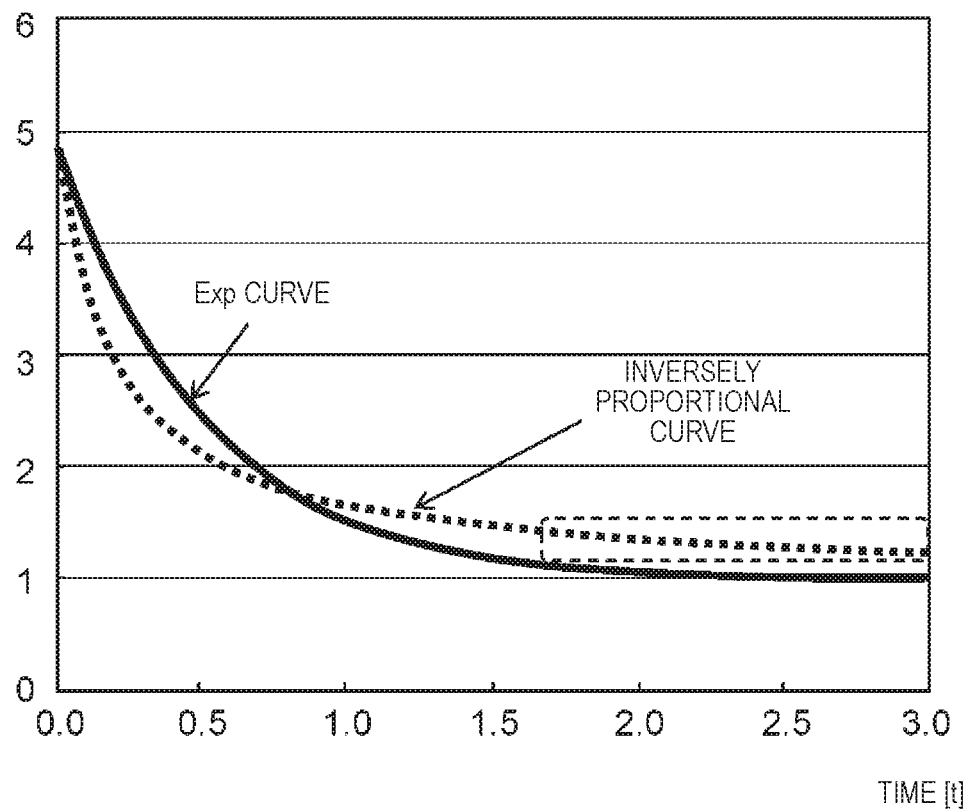
FIG. 6 illustrates a comparison between terminal voltages estimated using the terminal voltage estimation model, which is the first-order equivalent circuit, and terminal voltages estimated using the terminal voltage estimation model constructed using the inversely proportional curve.

FIG. 6 illustrates a comparison between terminal voltages estimated with the terminal voltage estimation model, which is the first-order equivalent circuit, and terminal voltages estimated with the terminal voltage estimation model constructed using the inversely proportional curve. As illustrated in FIG. 6, an Exp curve obtained with the terminal voltage estimation model, which is the first-order equivalent circuit, converges more rapidly over time than does an inversely proportional curve obtained with the terminal voltage estimation model constructed using the inversely proportional curve. This characteristic makes it difficult for the Exp curve to express a slow-response component of a battery. On the other hand, the inversely proportional curve converges more slowly than does the Exp curve. This characteristic enables the inversely proportional curve to be variable when the Exp curve has converged and thus to express a slow-response component of a battery (as shown in a dotted box).

In inversely proportional curve-applied model processing 203, a present state estimation value and a state estimation value one step later are obtained using a Kalman filter from a present input value, a measured value, and a state estimation value one step before. In the present exemplary embodiment, an extended Kalman filter is used for a terminal voltage estimation model constructed using a non-linear inversely proportional curve. With the processing performed in inversely proportional curve-applied model processing 203, a difference between target value $R_1 i_L[k]$ of a terminal voltage and present value v is reduced, and an error is reduced according the difference, which is either positive or negative.

Figure 7:
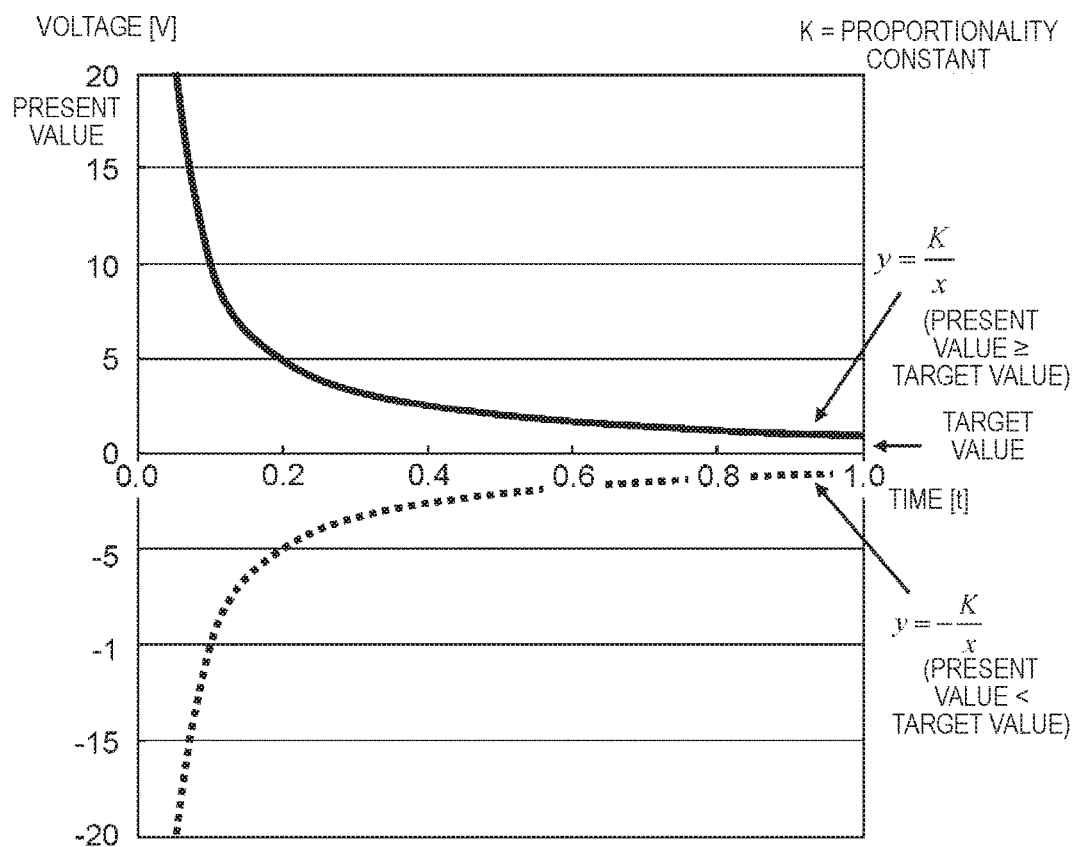
FIG. 7 illustrates an example of a function of the inversely proportional curve.

FIG. 7 illustrates an example of a function of the inversely proportional curve. As illustrated in FIG. 7, an inversely proportional curve of y=K/x is used, where K is a proportionality constant.

If the error is zero or positive (i.e., present value≥target value), the inversely proportional curve of y=K/x is used. If the error is negative (i.e., present value<target value), an inversely proportional curve of y=−K/x is used.

Specifically, if present value≥target value, for example, a computation is performed as follows:

$$y = \frac{K}{x} \equiv v - \frac{\text{target}}{\text{value}}, \dot{v} = -\frac{K}{x^2} \quad \text{[Formula 13]}$$

$$\frac{v[k+1]-v[k]}{\Delta t} = -\frac{K}{x[k]\cdot x[k]}$$

$$x[k] = \frac{K}{v[k] - \text{target value}}$$

$$\frac{v[k+1]-v[k]}{\Delta t} = -\frac{1}{K}(v[k]-R_1 i_L[k])^2 \left(\left|\begin{matrix}\text{target}\\\text{value}\end{matrix}\right. \equiv R_1 i_L[k]\right)$$

If present value<target value, a computation is performed as follows:

$$y = -\frac{K}{x} \equiv v - \frac{\text{target}}{\text{value}}, \dot{v} = \frac{K}{x^2} \quad \text{[Formula 14]}$$

-continued $$\frac{v[k+1] - v[k]}{\Delta t} = \frac{1}{K}(v[k] - R_1 i_L[k])^2$$

The formulae are combined and processed as follows:

$$e[k] = v[k] - R_1 i_L[k] \quad \text{[Formula 15]}$$

$$\frac{v[k+1] - v[k]}{\Delta t} = -\text{sign}(e[k]) \cdot \frac{e[k]^2}{K}$$

$$v[k+1] = v[k] - \text{sign}(e[k]) \cdot \frac{e[k]^2}{K'} \quad \left(K' = \frac{K}{\Delta t}\right)$$

First Modified Example

As the inversely proportional curve, the function, y=K/x, may be replaced with a function, y=K/xp, that is inversely proportional to a power. If present value≥target value in that case, a computation is performed as follows:

$$y = \frac{K}{x^p} \equiv v - \frac{\text{target}}{\text{value}}, \quad \dot{v} = -\frac{pK}{x^{p+1}} \quad \text{[Formula 16]}$$

$$\frac{v[k+1] - v[k]}{\Delta t} = -\frac{pK}{x[k]^{p+1}}$$

$$x[k]^p = \frac{K}{\left|v[k] - \frac{\text{target}}{\text{value}}\right|}$$

$$\frac{v[k+1] - v[k]}{\Delta t} = -\frac{p|v[k] - R_1 i_L[k]|^{\frac{p+1}{p}}}{\sqrt[p]{K}}$$

$$\left(\frac{\text{target}}{\text{value}} \equiv R_1 i_L[k]\right)$$

If present value<target value, a computation is performed as follows:

$$y = -\frac{K}{x^p} \equiv v - \frac{\text{target}}{\text{value}}, \quad \dot{v} = \frac{pK}{x^{p+1}} \quad \text{[Formula 17]}$$

$$x[k]^p = \frac{K}{\left|v[k] - \frac{\text{target}}{\text{value}}\right|}$$

$$\frac{v[k+1] - v[k]}{\Delta t} = \frac{p|v[k] - R_1 i_L[k]|^{\frac{p+1}{p}}}{\sqrt[p]{K}}$$

The formulae are combined and processed as follows:

$$e[k] = v[k] - R_1 i_L[k] \quad \text{[Formula 18]}$$

$$\frac{v[k+1] - v[k]}{\Delta t} = -\text{sign}(e[k]) \cdot \frac{p|e[k]|^{\frac{p+1}{p}}}{\sqrt[p]{K}}$$

$$v[k+1] = v[k] - \text{sign}(e[k]) \cdot \frac{p|e[k]|^{\frac{p+1}{p}} \Delta t}{\sqrt[p]{K}}$$

Figure 8:
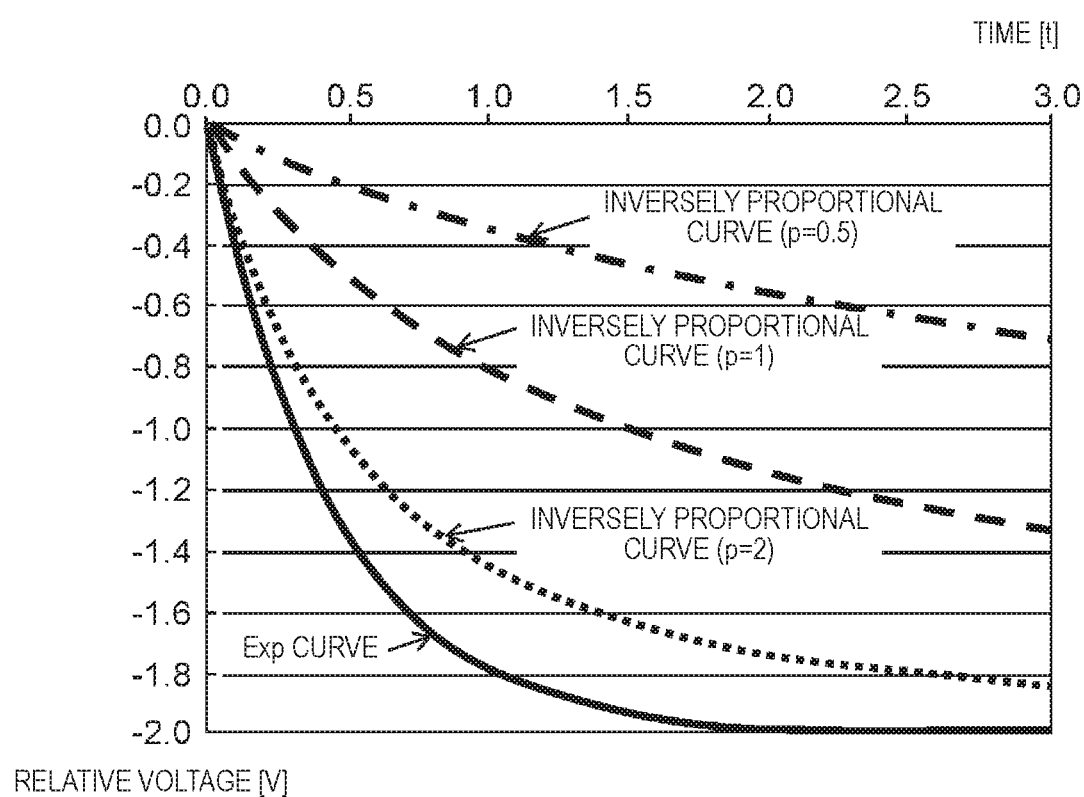
FIG. 8 illustrates examples of a function that is inversely proportional to a power.

FIG. 8 illustrates an example of a function that is inversely proportional to a power. As illustrated in FIG. 8, in inversely proportional curve-applied model processing 203, multiplier p appropriate to a function inversely proportional to a power may be set, based on at least one of conditions including an estimated SOC, an estimated terminal voltage, and a type of a battery. For example, Kalman filter SOC estimating part 104 may set larger multiplier p for a battery in which an amount of change in a slow-response component is large.

Second Modified Example

In the above computation, x[k]·x[k] may be replaced with x[k]·x[k+1]. If present value≥target value in that case, a computation is performed as follows:

$$y = \frac{K}{x} \equiv v - \frac{\text{target}}{\text{value}}, \quad \dot{v} = -\frac{K}{x^2} \quad \text{[Formula 19]}$$

$$\frac{v[k+1] - v[k]}{\Delta t} = -\frac{K}{x[k] \cdot x[k+1]}$$

$$x[k] = \frac{K}{v[k] - \frac{\text{target}}{\text{value}}}, \quad x[k+1] = \frac{K}{v[k+1] - \frac{\text{target}}{\text{value}}}$$

$$\frac{v[k+1] - v[k]}{\Delta t} = -\frac{1}{K}(v[k] - R_1 i_L[k])(v[k+1] - R_1 i_L[k])$$

$$\left(\frac{\text{target}}{\text{value}} \equiv R_1 i_L[k]\right)$$

If present value<target value, a computation is performed as follows:

$$y = -\frac{K}{x} \equiv v - \frac{\text{target}}{\text{value}}, \quad \dot{v} = \frac{K}{x^2} \quad \text{[Formula 20]}$$

$$\frac{v[k+1] - v[k]}{\Delta t} = \frac{1}{K}(v[k] - R_1 i_L[k])(v[k+1] - R_1 i_L[k])$$

$$\frac{v[k+1] - v[k]}{\Delta t} = -\frac{1}{K}(R_1 i_L[k] - v[k])(v[k+1] - R_1 i_L[k])$$

The formulae are combined and processed as follows:

$$e[k] = v[k] - R_1 i_L[k] \quad \text{[Formula 21]}$$

$$\frac{v[k+1] - v[k]}{\Delta t} = -\frac{1}{K}|e[k]|(v[k+1] - R_1 i_L[k])$$

$$\left(1 + \frac{\Delta t}{K}|e[k]|\right)v[k+1] = v[k] + \frac{\Delta t}{K}|e[k]|R_1 i_L[k]$$

$$v[k+1] = \frac{K'}{K' + |e[k]|}v[k] + \frac{|e[k]|R_1}{K' + |e[k]|}i_L[k] =$$

$$\frac{K'e[k]}{K' + |e[k]|} + R_1 i_L[k]$$

$$\left(K' = \frac{K}{\Delta t}\right)$$

A description will be given of a state-space representation of a terminal voltage estimation model that is constructed using an inversely proportional curve, the state-space representation being used by Kalman filter SOC estimating part 104.

The following formula is used for calculating an OCV.

$$x_1[k+1] = \begin{bmatrix} SOC[k+1] \\ b_0[k+1] \end{bmatrix} = \begin{bmatrix} 1 & 0 \\ 0 & 1 \end{bmatrix} \begin{bmatrix} SOC[k] \\ b_0[k] \end{bmatrix} + \begin{bmatrix} \frac{-\Delta t}{Q_R} \\ 0 \end{bmatrix} i_L[k] \quad \text{[Formula 22]}$$

The following formula is used for calculating a polarization component.

$$x_2[k+1] = \begin{bmatrix} v[k+1] \\ K[k+1] \end{bmatrix} = \begin{bmatrix} v[k] - \text{sign}(v[k] - R_1' i_L[k]) \cdot \frac{(v[k] - R_1' i_L[k])^2 \Delta t}{K[k]} \\ K[k] \end{bmatrix} \quad \text{[Formula 23]}$$

The formulae are used to form the following formula for expressing an estimated terminal voltage.

$$v_T[k] = \begin{bmatrix} b_1 & 1 & -1 & 0 \end{bmatrix} \begin{bmatrix} x_1[k] \\ x_2[k] \end{bmatrix} - R_0 i_L[k] \quad \text{[Formula 24]}$$

Then, the formula for calculating a polarization component becomes the following non-linear space representation:

$$\begin{bmatrix} v[k+1] \\ K[k+1] \end{bmatrix} \quad \text{[Formula 25]}$$

In this case, proportionality constant k cannot be identified with an ARX model. In order to make the identification possible, Kalman filter SOC estimating part 104 includes constant proportionality k in a state vector, and performs a simultaneous optimization using an extended Kalman filter.

A description will be given of resistance $R_1'$ of an inversely proportional curve in the formula for calculating a polarization component. Kalman filter SOC estimating part 104 corrects $R_1'$ so that $R_1'$ equals a value that is obtained by multiplying, by a constant, resistance value $R_1$ of a first-order equivalent circuit which is estimated by equivalent circuit parameter estimating part 102. The factor of correction may be changed in charging and discharging because an attenuation characteristic of a terminal voltage is different in both the operations.

Figure 9:
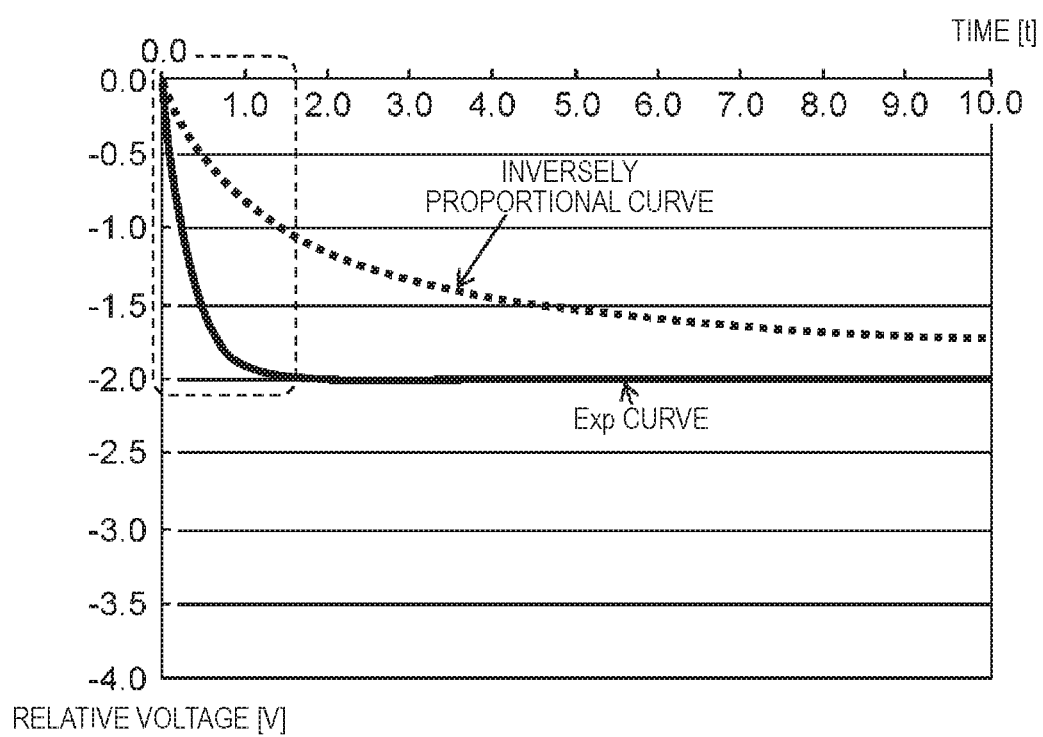
FIG. 9 illustrates a comparison between estimated terminal voltages obtained by applying, to the terminal voltage estimation model constructed using the inversely proportional curve, a resistance value estimated using the terminal voltage estimation model, which is the first-order equivalent circuit, without correcting the resistance value.
Figure 10:
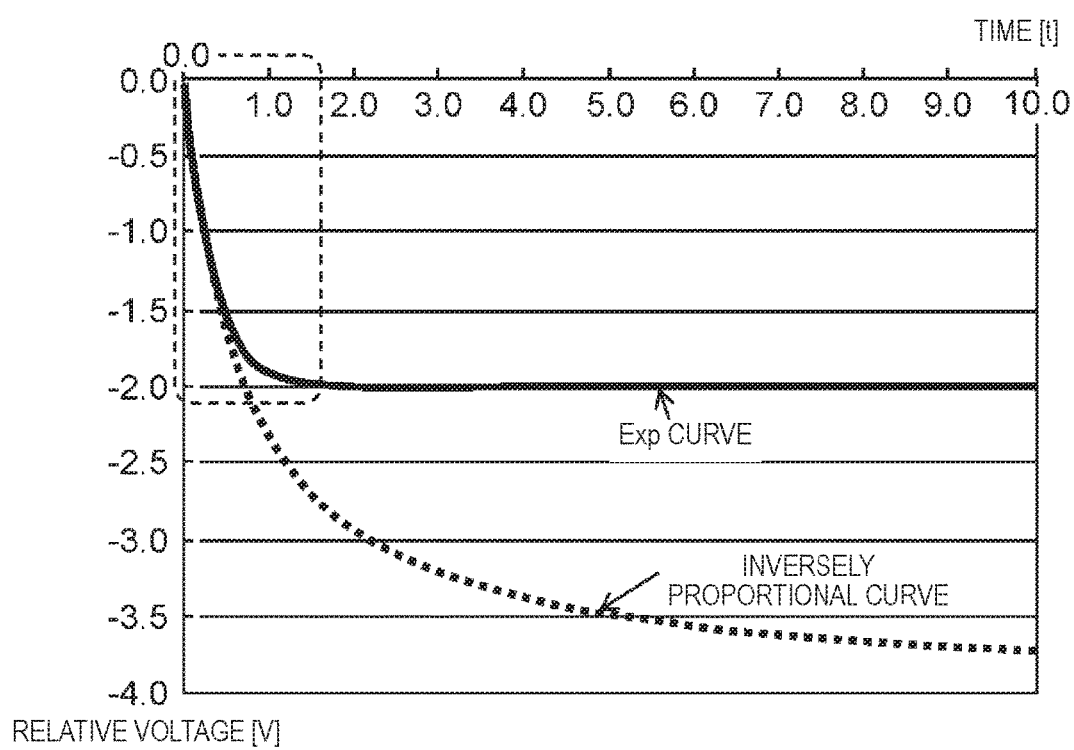
FIG. 10 illustrates a comparison between estimated terminal voltages obtained by correcting and applying, to the terminal voltage estimation model constructed using the inversely proportional curve, a resistance value estimated using the terminal voltage estimation model, which is the first-order equivalent circuit.

FIG. 9 illustrates a comparison between terminal voltages obtained by applying, to the terminal voltage estimation model constructed using the inversely proportional curve, a resistance value estimated with the terminal voltage estimation model, which is the first-order equivalent circuit, without correcting the resistance value. FIG. 10 illustrates a comparison between terminal voltages obtained by correcting and applying, to the terminal voltage estimation model constructed using the inversely proportional curve, a resistance value estimated with the terminal voltage estimation model, which is the first-order equivalent circuit. In the Exp curve (illustrated in FIGS. 3 and 4) corresponding to the terminal voltage estimation model, which is the first-order equivalent circuit, for example, terminal voltages are expressed with relatively high accuracy at a fast-response portion of a battery, as illustrated in FIG. 9. As illustrated in FIG. 9, with an inversely proportional curve corresponding to the terminal voltage estimation model constructed using the inversely proportional curve, an amount of change in voltages is kept from converging even at a slow-response portion of a battery, so that terminal voltages are accurately estimated. With the Exp curve corresponding to the terminal voltage estimation model, which is the first-order equivalent circuit, a polarization component is estimated with relatively high accuracy at the fast-response portion of the battery (a portion within a dotted line). With the inversely proportional curve, a polarization component is estimated with relatively low accuracy because the inversely proportional curve uses the same resistance $R_1$ of the first-order equivalent circuit as that of the Exp curve, which causes the inversely proportional curve to converge to a value identical to that reached by the Exp curve and thus to have an amount of change small at the fast-response portion of the battery. As illustrated in FIG. 10, the inversely proportional curve overlaps the Exp curve at an early part of the fast-response portion of the battery (a portion within a dotted line). In order to achieve this, Kalman filter SOC estimating part 104 corrects resistance R1' of the inversely proportional curve so that resistance R1' equals a value obtained by multiplying, by a constant, resistance R1 of the first-order equivalent circuit.

Figure 11:
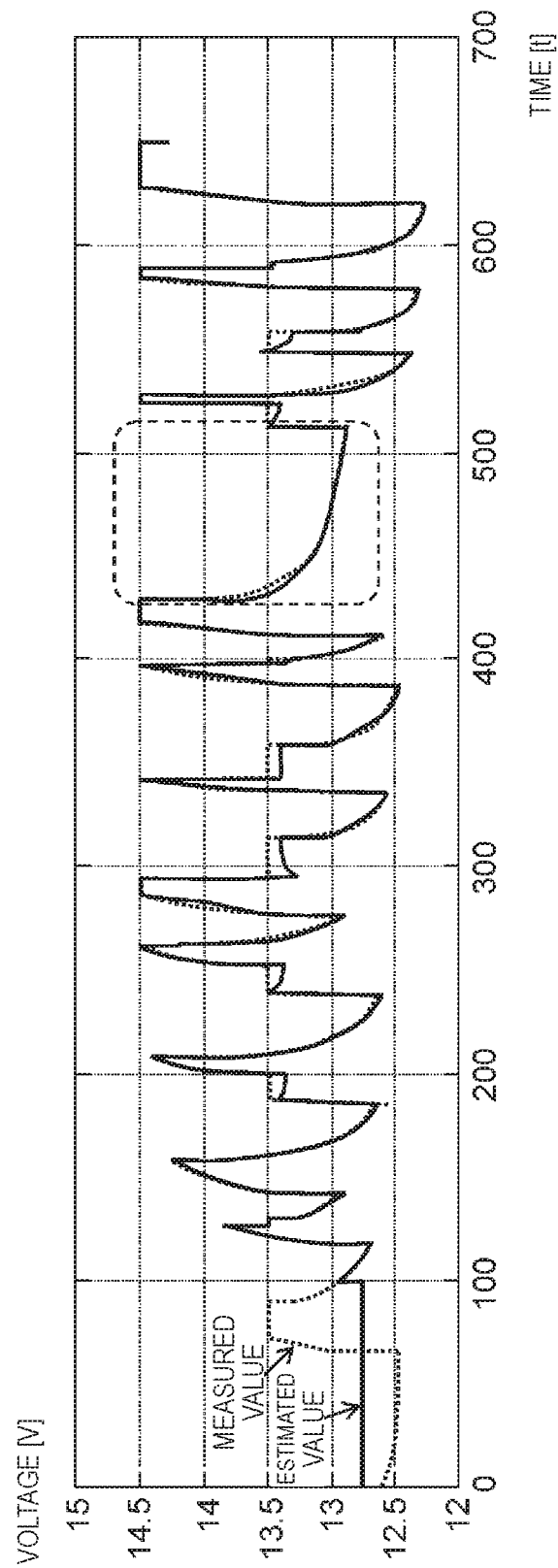
FIG. 11 illustrates an error between measured terminal voltages and terminal voltages estimated with the terminal voltage estimation model constructed using the inversely proportional curve.
Figure 12:
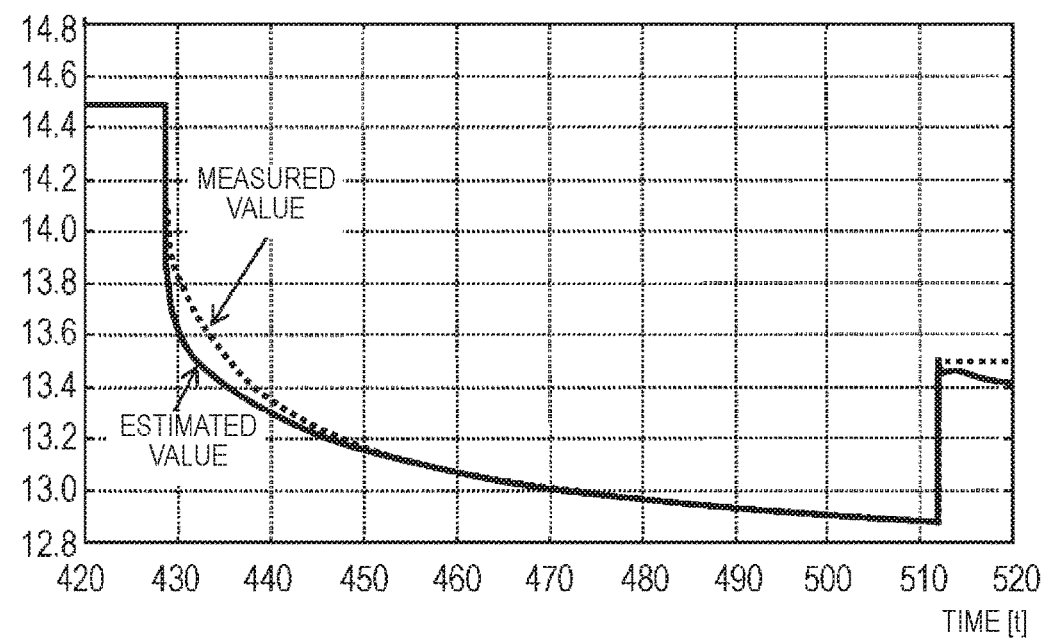
FIG. 12 is an enlarged view of a portion of FIG. 11 within a dotted line.

FIG. 11 illustrates an error between measured terminal voltages and terminal voltages estimated with the terminal voltage estimation model constructed using the inversely proportional curve. FIG. 12 is an enlarged view of a portion of FIG. 11 within a dotted line. As illustrated in FIGS. 11 and 12, a polarization component of a long time constant is estimated with high accuracy.

As described above, in the present exemplary embodiment, a terminal voltage is estimated using the equivalent circuit model constructed using the inversely proportional curve. This configuration enables a state estimation that considers a slow-response component of a battery, without using a higher-order equivalent circuit model. Accordingly, the first-order equivalent circuit model of simple construction enables a terminal voltage estimation and an associated SOC estimation for a battery. The present exemplary embodiment is applicable to an ECU that is designed for a stop-start system and which is limited in its processing ability because the present exemplary embodiment keeps an operational load low while preventing or inhibiting decrease in accuracy of the estimations.

Second Exemplary Embodiment

Figure 13:
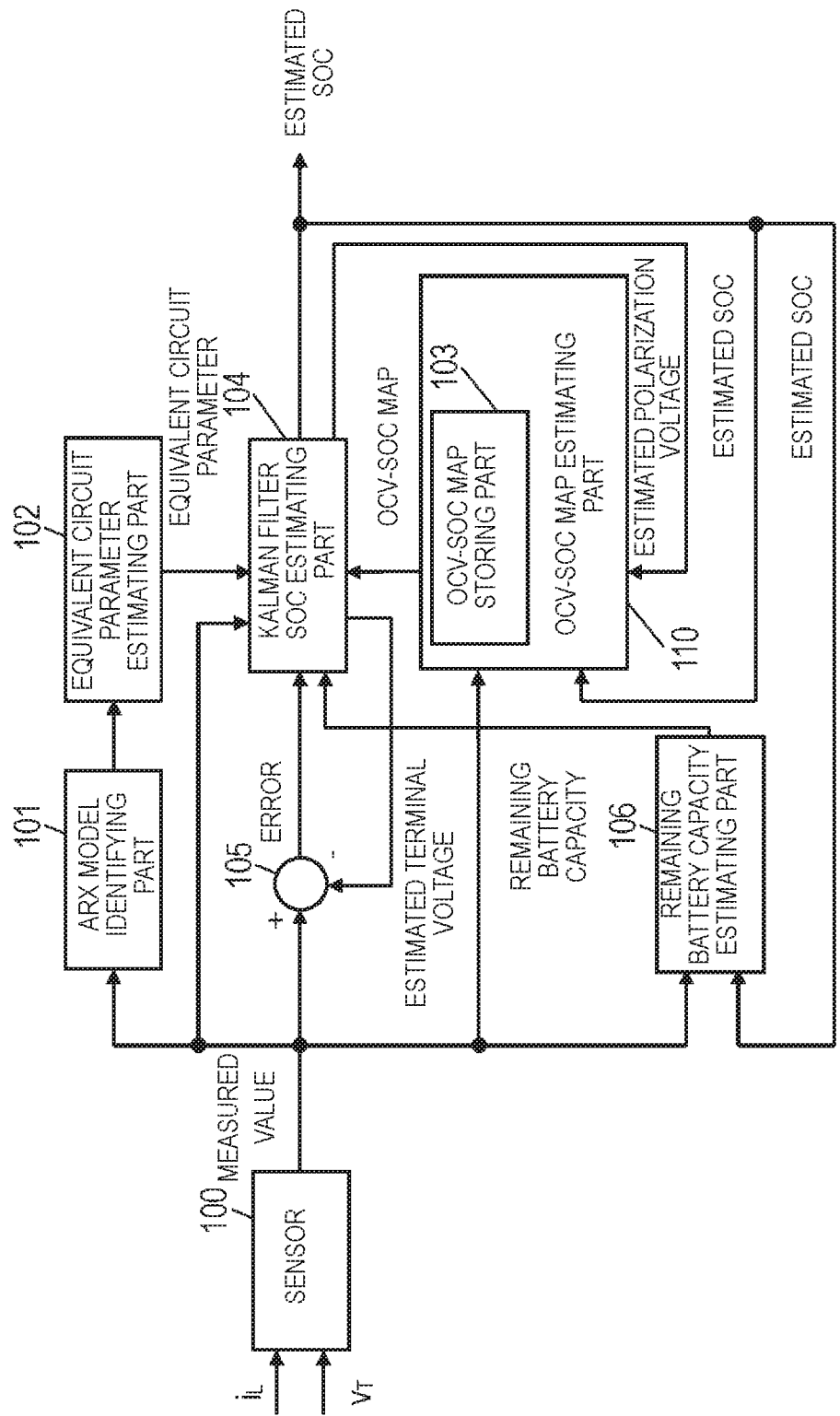
FIG. 13 is a block diagram illustrating a configuration of a battery state estimation device according to a second exemplary embodiment of the present invention.

With regard to a battery state estimation device (illustrated in FIG. 13) according to a second exemplary embodiment, configurations and elements are identical to those of the first exemplary embodiment, except that remaining battery capacity estimating part 106 and OCV-SOC map estimating part 110 perform their processes, and Kalman filter SOC estimating part 104 performs estimation in a different way.

The identical elements are given like reference numerals, and will not be described in detail.

Figure 14:
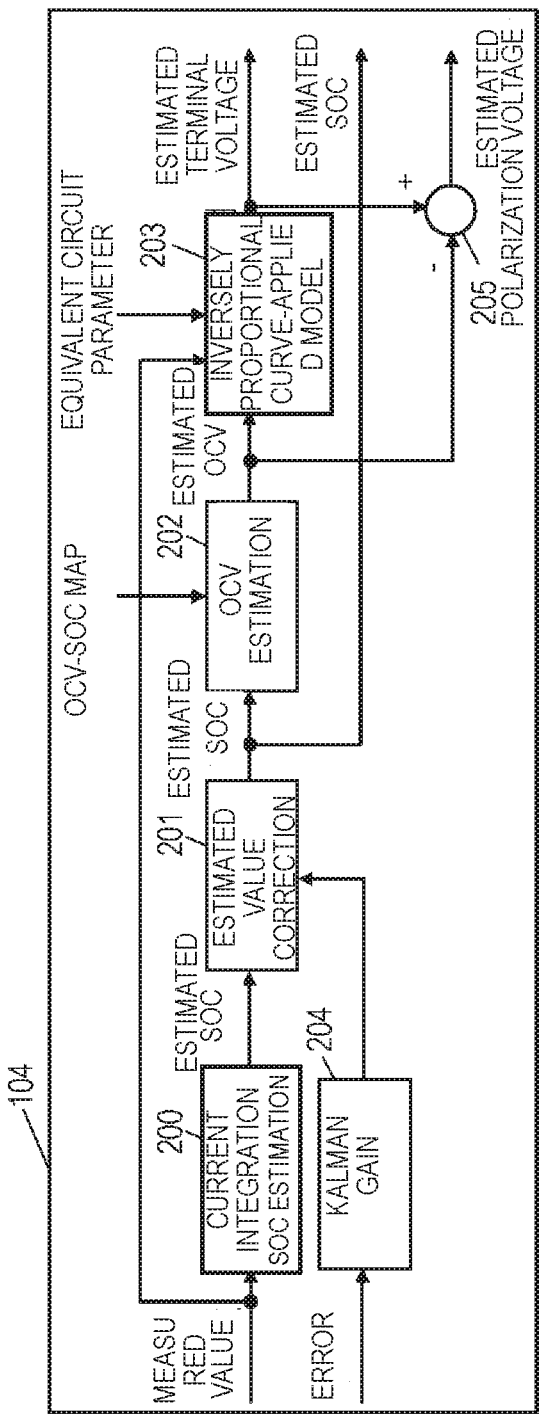
FIG. 14 illustrates a processing algorithm of a Kalman filter SOC estimating part illustrated in FIG. 13.

Kalman filter SOC estimating part 104 illustrated in FIG. 14 estimates an SOC using an OCV-SOC map (OCV=$b_0$+$b_1$*SOC) subjected to a linear approximation. Compared with the formulae (Formula 22 to Formula 25) of the first exemplary embodiment, a formula for calculating an OCV (Formula 22) and a formula for estimating a terminal voltage (Formula 24) in the present exemplary embodiment are different from those of the first exemplary embodiment in that the formulae (Formula 22 and Formula 24) in the first exemplary embodiment include b0 in a state vector whereas the formulae (Formula 22 and Formula 24) in the present exemplary embodiment include b0 in an input vector. Specifically, the OCV calculation in the present exemplary embodiment is given by the following formula:

$$x_1[k+1] = SOC[k+1] = SOC[k] + \begin{bmatrix} \frac{-\Delta t}{Q_R[k]} & 0 \end{bmatrix} \begin{bmatrix} i_L[k] \\ b_0[k] \end{bmatrix} \quad \text{[Formula 26]}$$

The terminal voltage estimation in the present exemplary embodiment is given by the following formula:

$$v_T[k] = \begin{bmatrix} b_1[k] & -1 & 0 \end{bmatrix} \begin{bmatrix} x_1[k] \\ x_2[k] \end{bmatrix} + \begin{bmatrix} -R_0 & 1 \end{bmatrix} \begin{bmatrix} i_L[k] \\ b_0[k] \end{bmatrix} \quad \text{[Formula 27]}$$

Although the OCV-SOC map subjected to a linear approximation is used for ease of calculation, a polynomial of degree n (OCV=$b_0$+$b_1$*SOC+$b_2$*SOC$^2$+ ... +$b_N$*SOC$^N$) may instead be used.

In performing error calculation processing 205, Kalman filter SOC estimating part 104 calculates an estimated polarization voltage, based on an error between an estimated OCV estimated in OCV estimation process 202 and an estimated terminal voltage estimated in inversely proportional curve-applied model processing 203, and outputs the estimated polarization voltage. Kalman filter SOC estimating part 104 calculates the estimated polarization voltage using, for example, the following formula:

$$v_p[k] = v[k] + R_0 i_L[k] \text{ or } v_p[k] = (R_0 + R_1) i_L[k] \quad \text{[Formula 28]}$$

Figure 16:
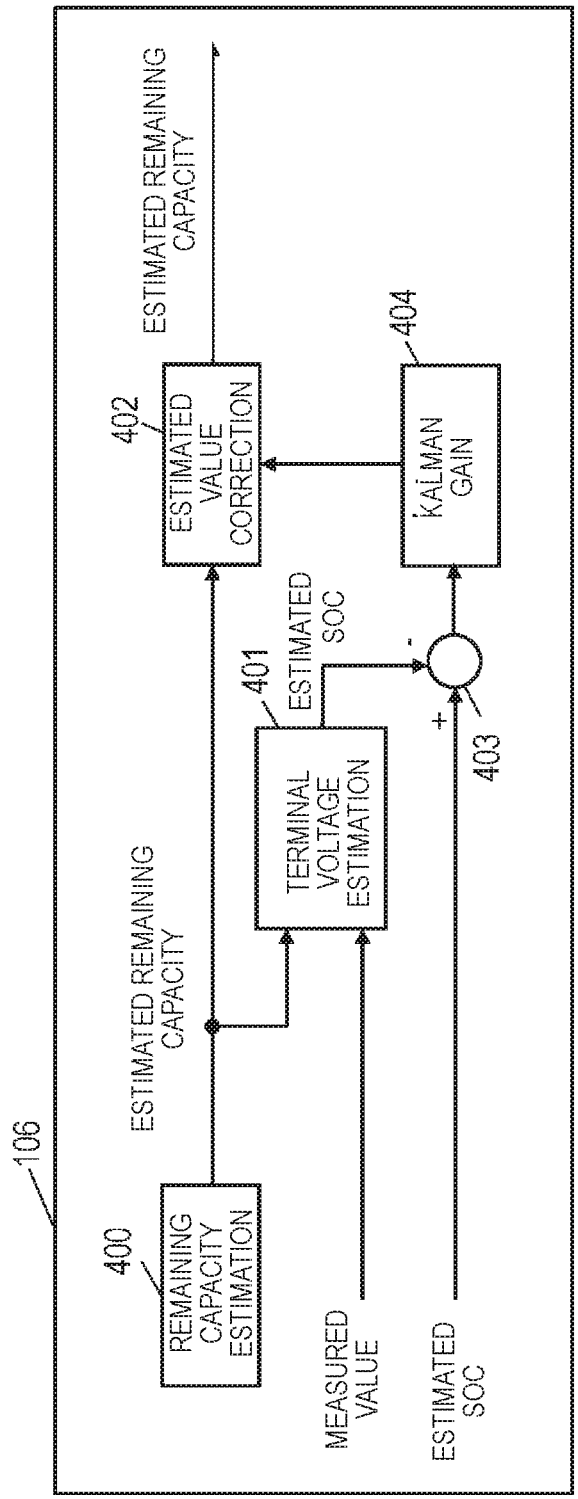
FIG. 16 illustrates a processing algorithm of a remaining battery capacity estimating part illustrated in FIG. 13.

Remaining battery capacity estimating part 106 illustrated in FIG. 16 estimates a remaining battery capacity so that an estimated SOC estimated by Kalman filter SOC estimating part 104 equals an estimated SOC obtained using a current integration method. An equation of state is given by:

$$x[k+1] = x[k] = \frac{1}{Q_R[k]} \quad \text{[Formula 29]}$$

An output equation is given by:

$$SOC_{cc}[k] = SOC_{cc}[k-1] - i_L[k]\Delta t \cdot x[k] \quad \text{[Formula 30]}$$

Formula 30 satisfies the following formula:

$$SOC_{cc}[0] = SOC[l] \quad \text{[Formula 31]}$$

SOC [l] corresponds to an estimated SOC that is output from Kalman filter SOC estimating part 104 when remaining battery capacity estimating part 106 starts estimation. The estimation by remaining battery capacity estimating part 106 is timed to start in this way because there are time delays between the estimation by remaining battery capacity estimating part 106 and the estimation by Kalman filter SOC estimating part 104.

A process (illustrated in FIG. 16) performed by remaining battery capacity estimating part 106 will be described. First, an estimated remaining capacity of a battery is calculated in remaining capacity estimation processing 400. Then, in current integration SOC estimation processing 401, an estimated SOC is estimated using a current integration method from the estimated remaining capacity of the battery and charge-discharge current value $i_L$ of the battery output from sensor 100. Then, in error calculation processing 403, an error is calculated between the estimated SOC estimated in current integration SOC estimation processing 401 and an estimated SOC estimated by Kalman filter SOC estimating part 104. Then, in Kalman gain processing 404, a correction rate is calculated for the estimated SOC, based on the calculated error. Then, in estimated value correction processing 402, the remaining capacity estimated in remaining capacity estimation processing 400 is corrected at the correction rate calculated in Kalman gain processing 404.

Preferably, remaining battery capacity estimating part 106 operates to perform the estimation processing over a longer period than does Kalman filter SOC estimating part 104. With regard to a change in a characteristic, a time constant of a remaining battery capacity is longer than that of an SOC. Accordingly, if remaining battery capacity estimating part 106 operates to perform the estimation processing over a period identical to that of Kalman filter SOC estimating part 104, results of the estimation by remaining battery capacity estimating part 106 vary greatly, reducing accuracy in the estimation. The prediction accuracy is prevented from decreasing by configuring remaining battery capacity estimation part 106 to operate to perform the estimation processing over a longer period than that of Kalman filter SOC estimating part 104.

Figure 15:
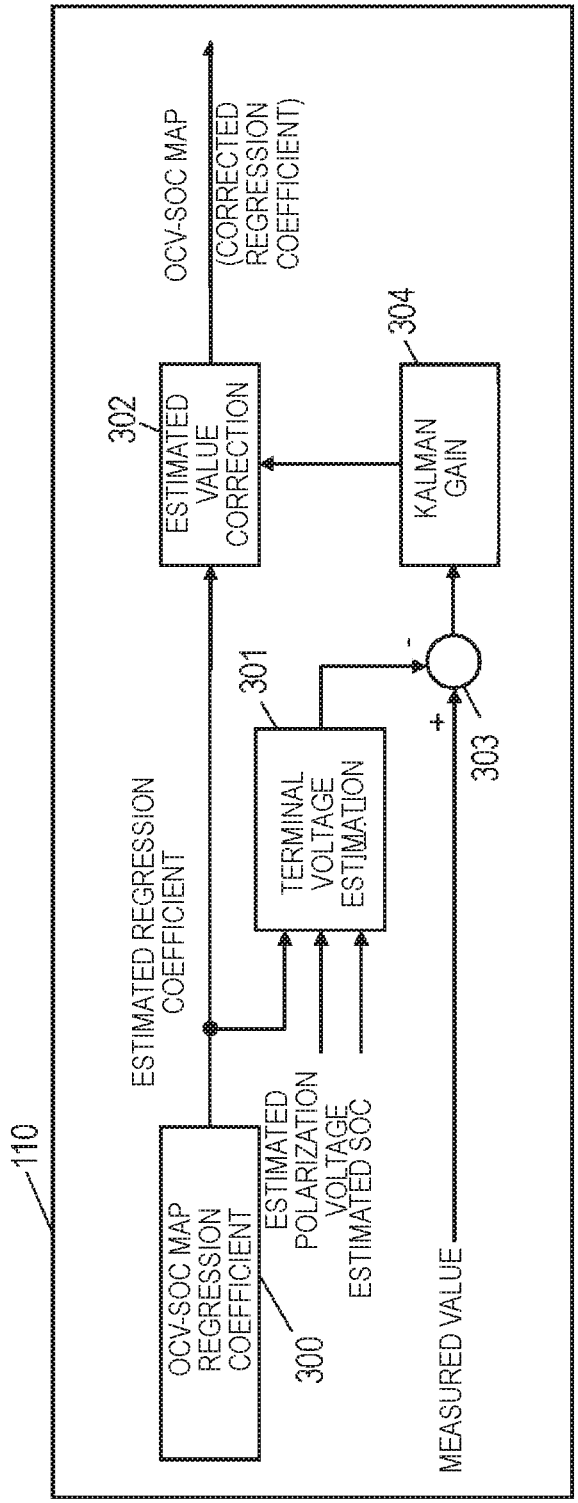
FIG. 15 illustrates a processing algorithm of an OCV-SOC estimating part illustrated in FIG. 13.

OCV-SOC map estimating part 110 illustrated in FIG. 15 reads an OCV-SOC map from OCV-SOC map storing part 103 and corrects the OCV-SOC map, rather than simply reading the OCV-SOC map.

OCV-SOC map estimating part 110 estimates a relationship between an OCV and an SOC of a battery, based on an estimated polarization voltage and an estimated SOC estimated by Kalman filter SOC estimating part 104 and on charge-discharge current value $i_L$ and terminal voltage value $v_T$ which sensor 100 detects and outputs.

An equation of state used by OCV-SOC map estimating part 110 is given by the following formula:

$$x[k+1] = x[k] = \begin{bmatrix} b_0[k] \\ b_1[k] \end{bmatrix} \quad \text{[Formula 32]}$$

An output equation is given by:

$$v_T[k] = [1 \, SOC[k]]x[k] + v_p[k] \quad \text{[Formula 33]}$$

The regression coefficient, $[b_0, b_1]^T$, is used in a linear approximation for ease of calculation, but a determinant $[b_0, b_1, b_2, \ldots b_N]^T$ is used in the case of a polynomial of degree n.

A process performed by OCV-SOC map estimating part 110 will be described.

First, in OCV-SOC map regression coefficient estimation processing 300, random numbers are regularly generated in accordance with a random walk, using the output formula (Formula 32), and the regression coefficient, $[b_0, b_1]^T$, is estimated.

Then, in terminal voltage estimation processing 301, a terminal voltage is estimated from an estimated polarization voltage and an estimated SOC output from Kalman filter SOC estimating part 104 and on random numbers generated in OCV-SOC map regression coefficient estimation processing 300. Then, in error calculation processing 303, an error is calculated between estimated terminal voltage $v_T[k]$ estimated in terminal voltage estimation processing 301 and measured terminal voltage $v_T$ output from sensor 100. Then, in Kalman gain processing 304, Kalman gain is calculated, based on the error calculated in error calculation processing 303. Then, in estimated value correction processing 302, the regression coefficient, $[b_0, b_1]^T$, serving as a state variable is corrected using, as a correction rate, the Kalman gain calculated in Kalman gain processing 304. The corrected regression coefficient is output to Kalman filter SOC estimating part 104.

OCV-SOC map estimating part 110 may operate to perform the estimation processing over a longer period than does Kalman filter SOC estimating part 104, as with the period with which remaining battery capacity estimation part 106 operates to perform the estimation processing. This configuration prevents accuracy of the estimation from decreasing, as in the case of SOC estimation part 106.

The exemplary embodiments of the present invention have been described. It should be noted that the elements and methods described in the exemplary embodiments of the present invention are not of limitation, and can be modified as appropriate without departing from the scope of the present invention. For example, in the exemplary embodiments of the present invention, the equivalent circuit parameters are estimated using ARX model identifying part 101 and equivalent circuit parameter estimating part 102, but the equivalent circuit parameters may be estimated by Kalman filter SOC estimating part 104. Additionally, ARX model identifying part 101 and equivalent circuit parameter estimating part 102 may be eliminated by including the equivalent circuit parameter in an equation of state used by Kalman filter SOC estimating part 104. Further, ARX model identifying part 101 may be eliminated also by using other models other than ARX models, and other methods.

INDUSTRIAL APPLICABILITY

The battery state estimation device and the method of estimating a battery state according to the exemplary embodiments of the present invention are useful for detecting a state of a lead-acid battery for use in starting, especially, a vehicle designed with a stop-start system.

The invention claimed is:

1. A method of operating a battery state estimation device, the method comprising:
    detecting, by one or more sensors, a charge-discharge current and a terminal voltage of a battery;
    estimating a state-of-change (SOC) of the battery based on the charge-discharge current detected by the one or more sensors;
    correcting the estimated SOC by using a Kalman gain;
    estimating an open circuit voltage (OCV) of the battery based on the corrected SOC and a relationship between OCVs and SOCs of the battery, wherein the relationship is stored in the memory in advance of estimating the OCV;
    calculating an estimated terminal voltage based on the charge-discharge current detected by the one or more sensors and the estimated OCV of the battery and on equivalent circuit parameters constructed using an inversely proportional curve;
    calculating an error between the estimated terminal voltage and the terminal voltage detected by the one or more sensors; and
    correcting the Kalman gain based on the calculated error.

2. The method according to claim 1, further comprising: outputting the corrected SOC to a vehicle controller configured to control a vehicle.

3. A battery state estimation device, comprising:
    one or more sensors, which, in operation, detect a charge-discharge current and a terminal voltage of a battery;
    a memory, which, in operation, stores a relationship between open-circuit voltages (OCVs) and states of charge (SOCs) of the battery; and
    circuitry, which, in operation:
        estimates an SOC of the battery based on the charge-discharge current detected by the one or more sensors;
        corrects the estimated SOC by using a Kalman gain;
        estimates an OCV of the battery based on the corrected SOC and on the relationship between the OCVs and the SOCs of the battery stored in the memory;
        calculates an estimated terminal voltage based on the charge-discharge current detected by the one or more sensors and the estimated OCV of the battery and on equivalent circuit parameters constructed using an inversely proportional curve;
        calculates an error between the estimated terminal voltage and the terminal voltage detected by the one or more sensors; and
        corrects the Kalman gain based on the calculated error.

4. The battery state estimation device according to claim 3, wherein the circuitry estimates the equivalent circuit parameters based on an equivalent circuit that includes an inversely proportional curve-applied circuit.

5. The battery state estimation device according to claim 4, wherein an equivalent circuit model constructed using the inversely proportional curve is constructed using a function that is inversely proportional to a power.

6. The battery state estimation device according to claim 5, wherein the circuitry, in operation, estimates a parameter of an inversely proportional power of the equivalent circuit model, based on the charge-discharge current and the terminal voltage detected by the one or more sensors.

7. The battery state estimation device according to claim 6, wherein the circuitry, in operation, sets a component corresponding to a resistance of the equivalent circuit model so that the component equals a value obtained by multiplying, by a constant, a reference resistance value calculated using a first-order equivalent circuit model constructed using an exponential function.

8. The battery state estimation device according to claim 7, wherein the circuitry, in operation, sets a multiplying factor for the reference resistance value in charging and sets a different multiplying factor for the reference resistance value in discharging.

9. The battery state estimation device according to claim 8, wherein the circuitry, in operation, estimates a remaining battery capacity so that the estimated SOC equals an SOC calculated from the charge-discharge current detected by the one or more sensors using a current integration method, where the circuitry operates over a longer period for estimating the remaining battery capacity than a period for estimating the SOC.

10. The battery state estimation device according to claim 8, wherein:
    the circuitry, in operation, estimates a polarization voltage,
    the circuitry estimates the relationship between the OCVs and the SOCs of the battery, based on the estimated SOC and the estimated polarization voltage and on the charge-discharge current and the terminal voltage detected by the one or more sensors, and
    the circuitry, in operation, estimates a regression coefficient approximated using a regression equation of any order, and corrects the regression coefficient, based on the estimated SOC and on an error between a terminal voltage calculated using both a polarization voltage of the equivalent circuit model and the terminal voltage detected by the one or more sensors.

11. The battery state estimation device according to claim 3, wherein the circuitry, in operation, outputs the corrected SOC to a vehicle controller configured to control a vehicle.

12. The battery state estimation device according to claim 11, wherein the vehicle controller is configured to control a stop-start system of the vehicle based on the corrected SOC.

* * * * *